(12) United States Patent
Geusic

(10) Patent No.: US 6,998,787 B2
(45) Date of Patent: Feb. 14, 2006

(54) METHOD OF OPERATING A MICROCAVITY DISCHARGE DEVICE

(75) Inventor: Joseph E. Geusic, Berkeley Heights, NJ (US)

(73) Assignee: Micron Technology, Inc., Boise, ID (US)

(*) Notice: Subject to any disclaimer, the term of this patent is extended or adjusted under 35 U.S.C. 154(b) by 120 days.

(21) Appl. No.: 10/647,462

(22) Filed: Aug. 26, 2003

(65) Prior Publication Data

US 2004/0046503 A1 Mar. 11, 2004

Related U.S. Application Data

(62) Division of application No. 09/641,521, filed on Aug. 21, 2000, now Pat. No. 6,657,370.

(51) Int. Cl.
*G09G 3/10* (2006.01)
(52) U.S. Cl. .................. 315/169.1; 315/246; 345/60
(58) Field of Classification Search .............. 313/493, 313/631–634, 618, 359, 339, 326, 231.71; 250/493.1; 315/169.1, 246, 169.3; 345/60
See application file for complete search history.

(56) References Cited

U.S. PATENT DOCUMENTS

| | | | |
|---|---|---|---|
| 5,185,552 A | 2/1993 | Suzuki et al. |
| 5,327,475 A | 7/1994 | Golovanivsky et al. |
| 5,499,282 A | 3/1996 | Silfvast |
| 6,016,027 A | 1/2000 | DeTemple et al. |
| 6,031,241 A | 2/2000 | Silfvast et al. |

OTHER PUBLICATIONS

*W.T. Silfvast, "Intense EUV Incoherent Plasma Sources for EUV Lithography and Other Applications," Journal of Quantum Electronics, vol. 35, No. 5, May 1999, pp 700-708.
*J.W. Frame, et al., "Microdischarge Devices Fabricated in Silicon," Appl. Phys. Lett., 71(9), Sep. 1, 1997, pp. 1165-1167.
*A. El-Habachi et al., "Generation of Intense Excimer Radiation from High-Pressure Hollow Cathode Discharges," Appl. Phys. Lett., vol. 73, No. 7, Aug. 17, 1998, pp. 885-887.
*K.H. Schoenbach et al., "Microhollow Cathode Discharges," Apply. Phys. Lett., 68(1), Jan. 1, 1996, pp. 13-15.
*M.A. Klosner et al., "Intense Xenon Capillary Discharge Extreme-Ultraviolet Source in the 10-16-nm-Wavelength Region," Optics Letters, vol. 23, No. 20, Oct. 15, 1988, pp. 1609-1611.

Primary Examiner—Joseph Williams
(74) Attorney, Agent, or Firm—Dickstein Shapiro Morin & Oshinsky LLP

(57) ABSTRACT

A microcavity discharge device generates radiation with wavelengths in the range of from 11 to 14 nanometers. The device has a semiconductor plug, a dielectric layer, and an anode layer. A microcavity extends completely through the anode and dielectric layers and partially into the semiconductor plug. According to one aspect of the invention, a substrate layer has an aperture aligned with the microcavity. The microcavity is filled with a discharge gas under pressure which is excited by a combination of constant DC current and a pulsed current to produce radiation of the desired wavelength. The radiation is emitted through the base of the microcavity. A second embodiment has a metal layer which transmits radiation with wavelengths in the range of from 11 to 12 nanometers, and which excludes longer wavelengths from the emitted beam.

29 Claims, 7 Drawing Sheets

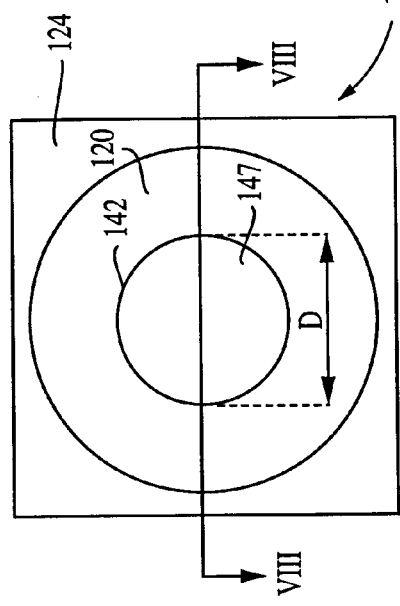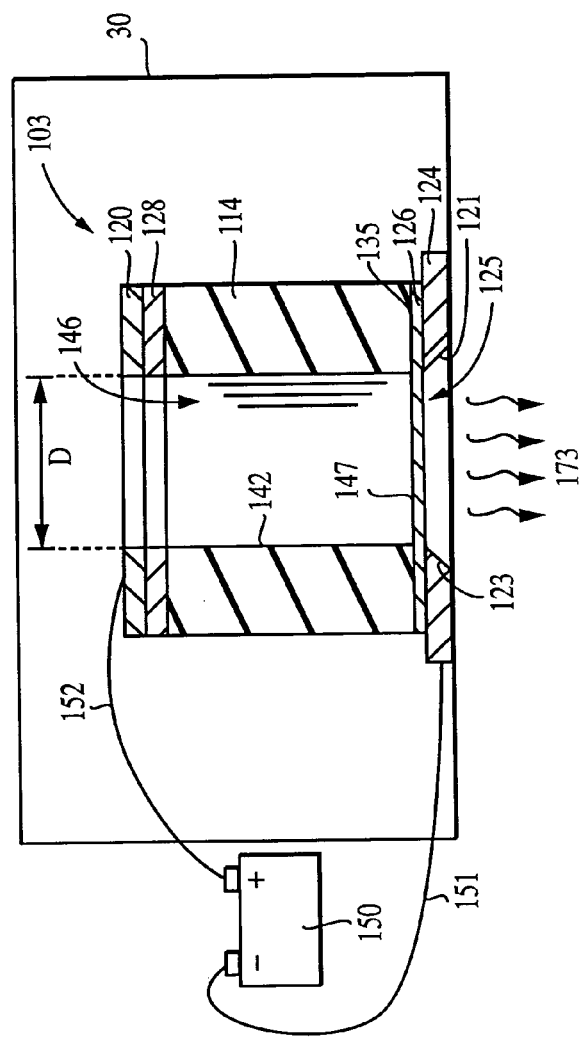

METHOD OF OPERATING A MICROCAVITY DISCHARGE DEVICE

CROSS REFERENCE TO RELATED APPLICATIONS

The present application is a divisional application of U.S. patent application Ser. No. 09/641,521, filed on Aug. 21, 2000 (now U.S. Pat. No. 6,657,370, issued on Dec. 2, 2003), the disclosure of which is herewith incorporated by reference in its entirety.

BACKGROUND OF THE INVENTION

The invention relates to microcavity devices and more particularly to a method and device for producing radiation useful in lithography systems.

DESCRIPTION OF RELATED ART

Integrated circuits are fabricated using lithography systems with a variety of radiation sources, such as for example mid-ultraviolet lithography. These sources produce ultraviolet radiation with wavelengths in the range of 100 to 500 nanometers. The ultraviolet radiation is used to expose photoresist during integrated circuit fabrication. Radiation emissions with wavelengths of 253–254 nanometers are produced by known microdischarge lamps using a discharge gas.

A known microdischarge lamp has a substrate, a cathode plug, a dielectric layer, and an anode layer. The lamp has a microcavity etched in the shape of a cylinder. The microcavity has an open end and a closed end. The microcavity extends through the anode and dielectric layers. The microcavity extends into the cathode layer to form a microcavity base. The diameter of the microcavity is in the range of 1 to 400 microns. The microcavity acts as a container for a discharge gas of mercury or xenon iodine. The discharge gas is supplied to the microcavity under pressure. The substrate layer and anode layer are formed of conductive materials. The cathode layer is formed of a doped silicon and the dielectric layer is formed of silicon dioxide. The cathode layer is secured to the substrate layer by an epoxy layer.

By using a semiconductor material for the cathode layer, uniform voltages can be formed along the length of the microcavity. A discharge gas that is maintained in the microcavity under pressure and subjected to electric current emits radiation through the open end of the microcavity. High energy electrons are released by the discharge gas which allows access to higher energy or ion states of gaseous atoms or molecules.

It has been suggested to operate a lamp by supplying a discharge gas to a microcavity and applying a constant electrical current of 4 milliamps between the anode and substrate layers. The discharge gas is supplied to the microcavity at a pressure of up to 200 torr. The lamp emits radiation with wavelengths in the 253 to 254 nanometer range. The lamp can be used in a lithography system. Radiation emitted from the lamp may be reflected off mirrors and through masks or reticles and onto the semiconductor wafer surface.

Ideal reflective surfaces for mirrors used in lithography systems include surfaces formed from molybdenum silicon (MoSi) and molybdenum beryllium (MoBe) compounds. These compounds attain their highest reflectivities, approximately 70%, when reflecting radiation with wavelengths in the 11 to 14 nanometers range. Therefore, what is needed is a microcavity discharge device which produces radiation emissions with wavelengths of less than 253 nanometers, and more particularly wavelengths in the range of from about 11 to about 14 nanometers.

SUMMARY OF THE INVENTION

The invention relates to a microcavity device which produces radiation with wavelengths in the extreme ultraviolet region. In accordance with one embodiment, the device has a semiconductor plug, a dielectric layer, and an anode layer. The dielectric layer electrically separates the semiconductor layer from the anode layer. A microcavity with an open end is formed in the anode layer. The microcavity extends through the dielectric layer and has a base in the semiconductor plug. Optionally, a substrate layer having an aperture aligned with the microcavity can be formed on the bottom surface of the semiconductor plug.

The microcavity is filled with a pressurized discharge gas, and the anode and substrate layers are supplied with a combination of constant and pulsed currents. The electrical pulses produce radiation from the discharge gas which are emitted from the microcavity through the bottom of the semiconductor layer and the aperture of the substrate layer. The radiation can be directed as a beam onto mirrors in an optical system. The mirrors be formed with highly reflective surfaces. When the discharge gas is xenon, the radiation has wavelength peaks in the range of from about 11 to about 14 nanometers.

In accordance with another aspect of the invention, a thin metal layer is located between the semiconductor plug and the substrate layer. When the metal layer is beryllium, the emitted radiation has wavelengths between 11 and 12 nanometers (wavelengths greater than about 12 nanometers are absorbed by the beryllium layer).

BRIEF DESCRIPTION OF THE DRAWINGS

These and other advantages and features of the invention will be more readily understood from the following detailed description of the invention which is provided in connection with the accompanying drawings.

FIG. 7 is a top view of a microcavity discharge device fabricated in accordance with a fourth embodiment of the invention;

FIG. 8 illustrates a discharge system fabricated in accordance with the fourth embodiment of the invention, and includes a cross sectional view of the device of FIG. 7, taken along line VIII—VIII;

DETAILED DESCRIPTION OF PREFERRED EMBODIMENTS

The present invention will be described as set forth in the preferred embodiments illustrated in FIGS. 1–11. Other embodiments may be utilized and structural and functional changes may be made without departing from the spirit or scope of the present invention. Like items are referred to by like reference numbers.

Figure 1:
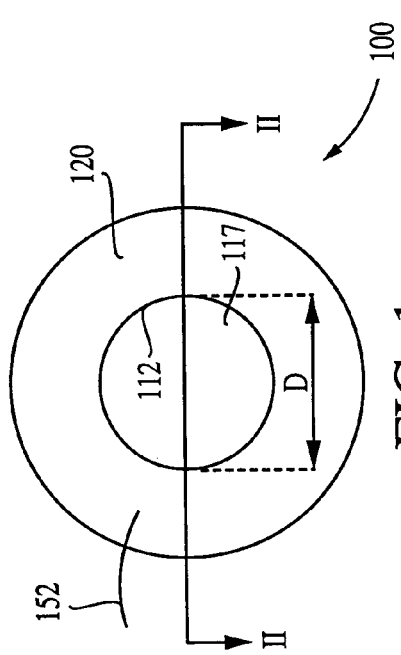
FIG. 1 is a top view of a microcavity discharge device fabricated in accordance with a first embodiment of the invention.

FIG. 1 shows a microcavity device 100 with a microcavity 112 fabricated in accordance with a first embodiment of the invention. The microcavfty 112 has a diameter D with an open end in the anode layer 120 and a closed end or bottom surface 117. The anode layer 120 is connected to a power supply via electrical connection 152.

Figure 2:
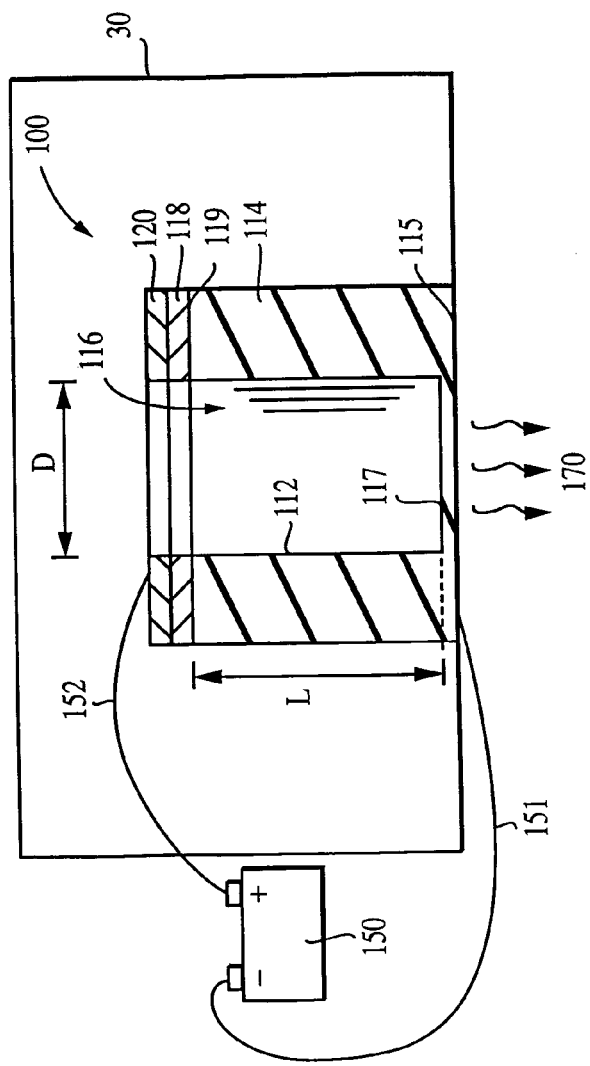
FIG. 2 illustrates a discharge system fabricated in accordance with the first embodiment of the invention, and includes a cross sectional view of the device of FIG. 1, taken along line II—II.

As shown in FIG. 2, the device 100 has a semiconductor plug 114 and a dielectric layer 118. The dielectric layer 118 is located between the plug and the anode layer 120. Thus, the dielectric layer 118 separates or electrically isolates the semiconductor plug 114 from the anode layer 120. The device 100 can be fabricated by depositing the dielectric layer 118 on the semiconductor plug 114 and depositing the anode layer 120 on top of the dielectric layer 118.

The microcavity 112 is formed in the device 100 with the bottom surface 117 formed in the semiconductor plug 114. The microcavity 112 is preferably cylindrical. The microcavity diameter D is preferably less than 120 microns, and more preferably in a range between 10 and 120 micrometers. Other microcavity shapes are also possible. The illustrated microcavity 112 is etched or drilled through the anode layer 120 and the dielectric layer 118 to a predetermined distance or depth L from the semiconductor layer top surface 119. The depth L of the microcavity 112 is preferably such that the distance between the microcavity bottom surface 117 and the semiconductor bottom surface 115 is in the range of from about 0.2 to about 0.8 microns. The hole depth L may be in the range of from about 20 to about 100 microns. The transmissivity of the closed end (through the bottom surface 117) may be about 50% for light at a wavelength of 13.5 nanometers.

The microcavity 112 acts as a container for a discharge gas 116. The gas 116 may include, for example, xenon. The discharge gas 116 is supplied through the open end of the microcavity 112. In FIG. 2, the device 100 is shown inside a pressure system 30 which supplies the discharge gas 116 to the microcavity 112. Formation of the microcavity 112 in a single piece integral semiconductor plug 114 allows the microcavity 112 to operate under higher pressure. The discharge gas 116 may be supplied to the microcavity 112 at a pressure that is greater than or equal to 200 torr. The pressure of the gas 116 may be in the range of from about 200 to about 600 torr.

The semiconductor plug 114 is preferably a highly conductive doped crystalline silicon or polysilicon cathode material with a thickness in the range of 20 to 100 microns. A silicon-based material is preferred because of its resistance to ion sputtering. The dielectric layer 118 is preferably a silicon dioxide or aluminum oxide with a dielectric strength range of 5 to 10 megavolts per centimeter and a thickness range of 4 to 10 microns. The anode layer 120 is preferably a high conductivity metal or a doped polysilicon. The anode layer 120 should have a resistivity of less than $1 \times 10^{-7}$ Ohms-meter and a thickness of 4 to 20 microns. The anode layer 120 may be formed of copper, gold, tungsten, aluminum, silver, doped silicon, nickel chromium, or the like.

The plug 114 and the anode layer 120 are connected to an electrical source 150 by respective electrical connections 151, 152. The electrical charge supplied by the source 150 consists of a small constant DC current and a short interval larger pulsed current, as described in more detail below. The DC current establishes a virtual anode plasma in the discharge gas 116. When the discharge gas 116 is subjected to the pulsed current, radiation 170 is emitted from the discharge gas 116 and exits through the microcavity bottom surface 117. The discharge gas 116 produces high energy electrons when subjected to electrical currents in the amount and size as described below.

The pulsed current further allows access to higher energy states of the gaseous atoms or molecules therein, such as for example $Xe^{+10}$ and $Xe^{+11}$, such that the wavelength of the radiation 170 is less than or equal to 253 nanometers, and may be in the range of approximately 11 to 14 nanometers. In a preferred embodiment of the invention, the radiation has wavelength peaks at 11.3 and 13.5 nanometers. These wavelengths may be used in extreme ultraviolet lithography systems.

Figure 3:
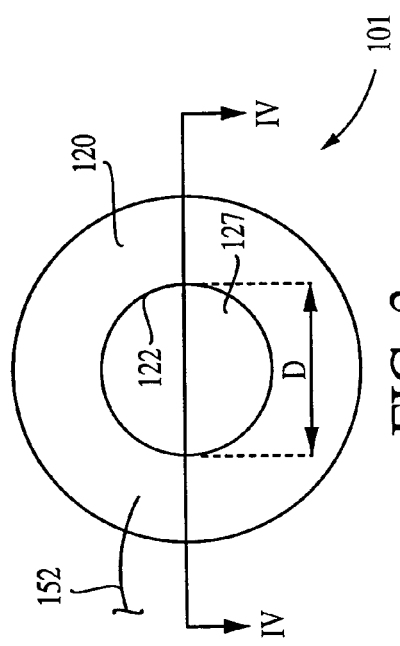
FIG. 3 is a top view of a microcavity discharge device fabricated in accordance with a second embodiment of the invention.
Figure 4:
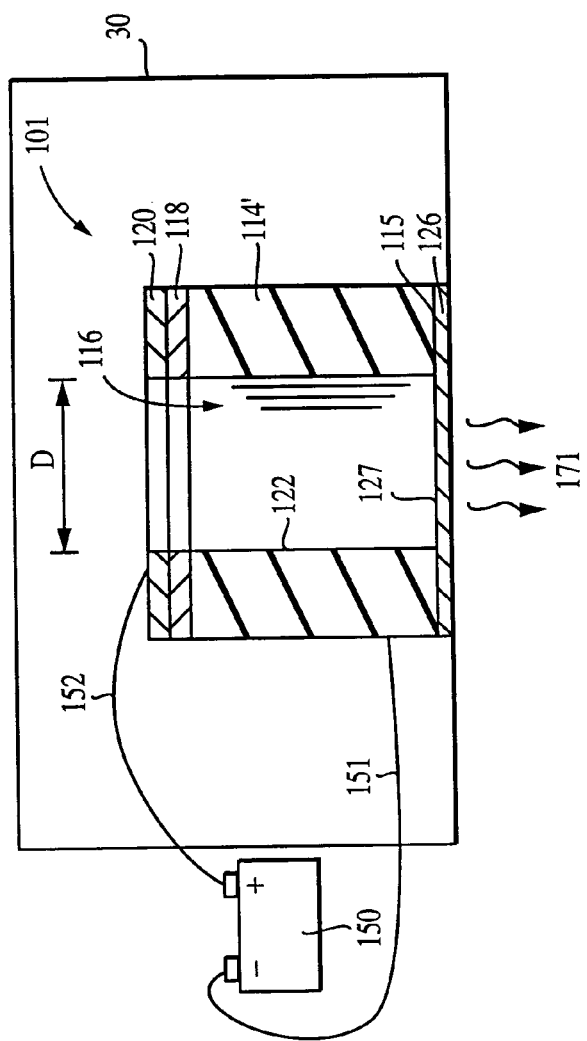
FIG. 4 illustrates a discharge system fabricated in accordance with the second embodiment of the invention, and includes a cross sectional view of the device of FIG. 3, taken along line IV—IV.

FIG. 3 shows a microcavity discharge device 101 with microcavity 122 fabricated in accordance with a second embodiment of the invention. The microcavity 122 has a diameter D and an open end in the anode layer 120 and a closed end or bottom surface 127. The anode layer 120 is connected to a power source 150 via electrical connection 152. The lower end of the semiconductor plug 114' is connected to the source 150 by another suitable electrical connection 151.

Device 101 differs from device 100 of FIGS. 1 and 2 by the presence of metal layer 126 located on the bottom surface 115 of the semiconductor plug 114'. The metal layer 126 may be formed on the bottom surface 115 of the semiconductor plug 114' by a known film growth process. The metal layer 126 has a thickness in the range of 0.2 to 0.8 microns, preferably about 0.6 microns. The metal layer 126 is preferably formed from beryllium. After the metal layer 126 is secured to the semiconductor plug bottom surface 115, the microcavity 122 is then etched completely through the semiconductor plug 114'. Thus, the base of the microcavity 122 is the top surface 127 of the metal layer 126. The device 101 is otherwise operated as described above in connection with FIG. 2. The beryllium layer 126 filters out (excludes) radiation that is outside the 11 to 12 nanometer range. Consequently, when the radiation 171 is emitted through the metal layer 126 the wavelengths are in the range of from about 11 to about 12 nanometers. The transmissivity of the closed end (through the metal layer 126) may be about 50% for light at a wavelength of 11.3 nanometers.

Figure 5:
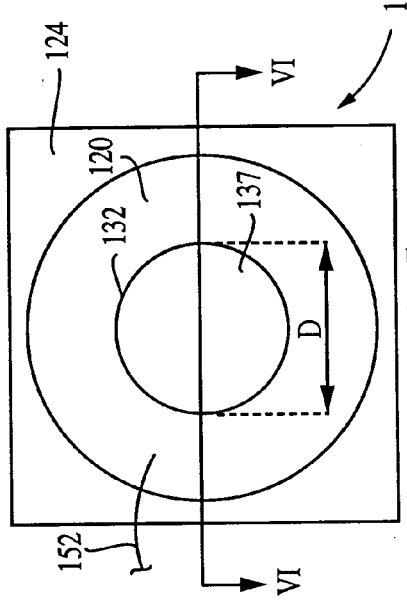
FIG. 5 is a top view of a microcavity discharge device fabricated in accordance with a third embodiment of the invention.

FIG. 5 is a top view of a microcavity discharge device 102 with a microcavity 132 fabricated in accordance with a third embodiment of the invention. The device 102 has a substrate 124. The microcavity 132 has a diameter D with an open end in the anode layer 120 and a closed end or bottom surface 137. The anode layer 120 is connected to a power source 150 via electrical connection 152.

Figure 6:
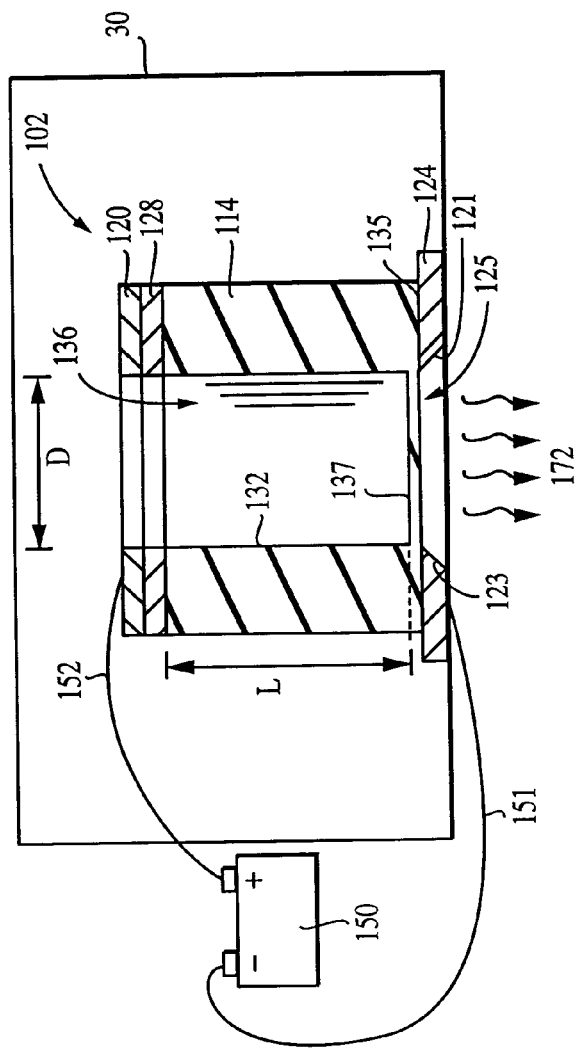
FIG. 6 illustrates a discharge system fabricated in accordance with the third embodiment of the invention, and includes a cross sectional view of the device of FIG. 5, taken along line VI—VI.

As shown in FIG. 6, device 102 varies from FIGS. 1 and 2 by the presence of a conductive substrate layer 124 located on the bottom surface 135 on the semiconductor plug 114. The substrate layer 124 can be secured or formed as a thin film by chemical or physical vapor deposition or as a metallic layer secured by epoxy or other techniques. An aperture 125 is formed in the substrate layer 124 and is aligned with the microcavity 132. The substrate layer 124 is connected to the source 150 by a suitable electrical connection 151. The substrate layer 124 is preferably a conductive material with a resistivity of less than $1 \times 10^{-7}$ ohms-meter and a thickness of 4 to 20 microns. The substrate layer 124 may include copper, gold, tungsten, aluminum, silver, doped silicon, nickel chromium, or the like.

The aperture 125 has sloped sides 121. The sloped sides 121 form a cone having an angle 123 with respect to vertical which is preferably in a range between 10 and 30 degrees. The angle 123 is preferably 10 degrees. The diameter of the truncated top of the cone 121 may be greater than or equal to the diameter D of the microcavity 132. The radiation 172 is emitted through the aperture 125 and are directed by the sloped sides 121. The device 102 is otherwise operated like the devices 100, 101, shown in FIGS. 1–4.

FIG. 7 is a top view of a microcavity discharge device 103 with a microcavity 142 fabricated in accordance with a fourth embodiment of the invention. The microcavity 142 has a diameter D and an open end in the anode layer 120 and a closed end or bottom surface 147. The device 103 has a substrate 124. The anode layer 120 is connected to a power source 150 via electrical connection 152. The source 150 is also connected to the substrate 124 by a suitable electrical connection 151.

Device 103 varies from FIGS. 5 and 6 by the presence of metal layer 126 located on the bottom surface of the semiconductor plug 114'. The metal layer 126 has a thickness in the range of about 0.2 to about 0.8 microns, preferably 0.6 microns. The metal layer 126 may include beryllium with a thickness of 0.6 microns. After the metal layer 126 is secured to the bottom of the semiconductor is plug 114', the microcavity 142 is then etched completely through the center of the semiconductor plug 114'. The base 147 of the microcavity 142 is the top surface of the metal layer 126. The device 103 is operated as described above in connection with FIGS. 1 through 6. The metal layer 126 can filter out undesired wavelengths. When the metal layer 126 is beryllium, radiation 173 having a wavelength in the range of about 11 to about 12 nanometers will be emitted through the closed end 147 of the microcavity 142.

Figure 9:
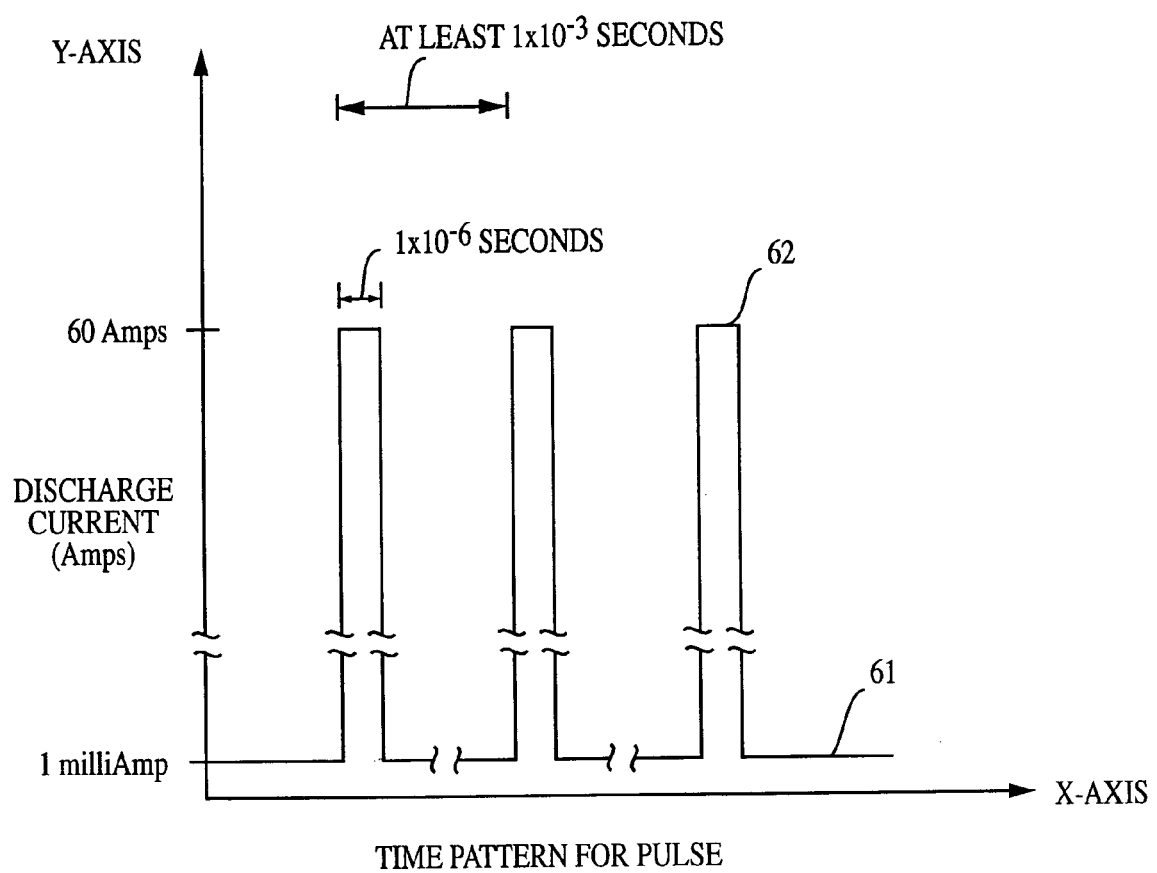
FIG. 9 shows the time intervals and amounts of current supplied to the discharge devices of FIGS. 1 through 8.

FIG. 9 is a plot of the amount of current versus duration that may be applied to the discharge devices 100 through 103 of FIGS. 1 through 8 to produce radiation with the desired wavelengths. The discharge devices operate at lower pulsed currents and are more compact than known devices. The x-axis represents time in microseconds, while the y-axis represents the current in amps supplied by the external power source 150. The DC current can vary between approximately 1 and 3 milliamps and the pulsed current 62 can vary between approximately 60 and 100 amps at a voltage of approximately 220 volts.

As shown in FIG. 9, a constant 1 milliamp DC current is supplied to the devices of FIGS. 1 through 8 (line 61) and a pulsed current of approximately 60 amps is supplied to the devices 100 through 103 (line 62). The pulsed current 62 may be supplied to the devices at a repetition rate of up to approximately $1 \times 10^3$ pulses per second to prevent adverse heating. The time between successive pulses should be approximately $1 \times 10^{-3}$ seconds or greater. The present invention should not be limited to the preferred embodiments described in detail herein. The duration of the pulsed current 62 may be about 1 microsecond or $1 \times 10^{-6}$ seconds or less.

Figure 10:
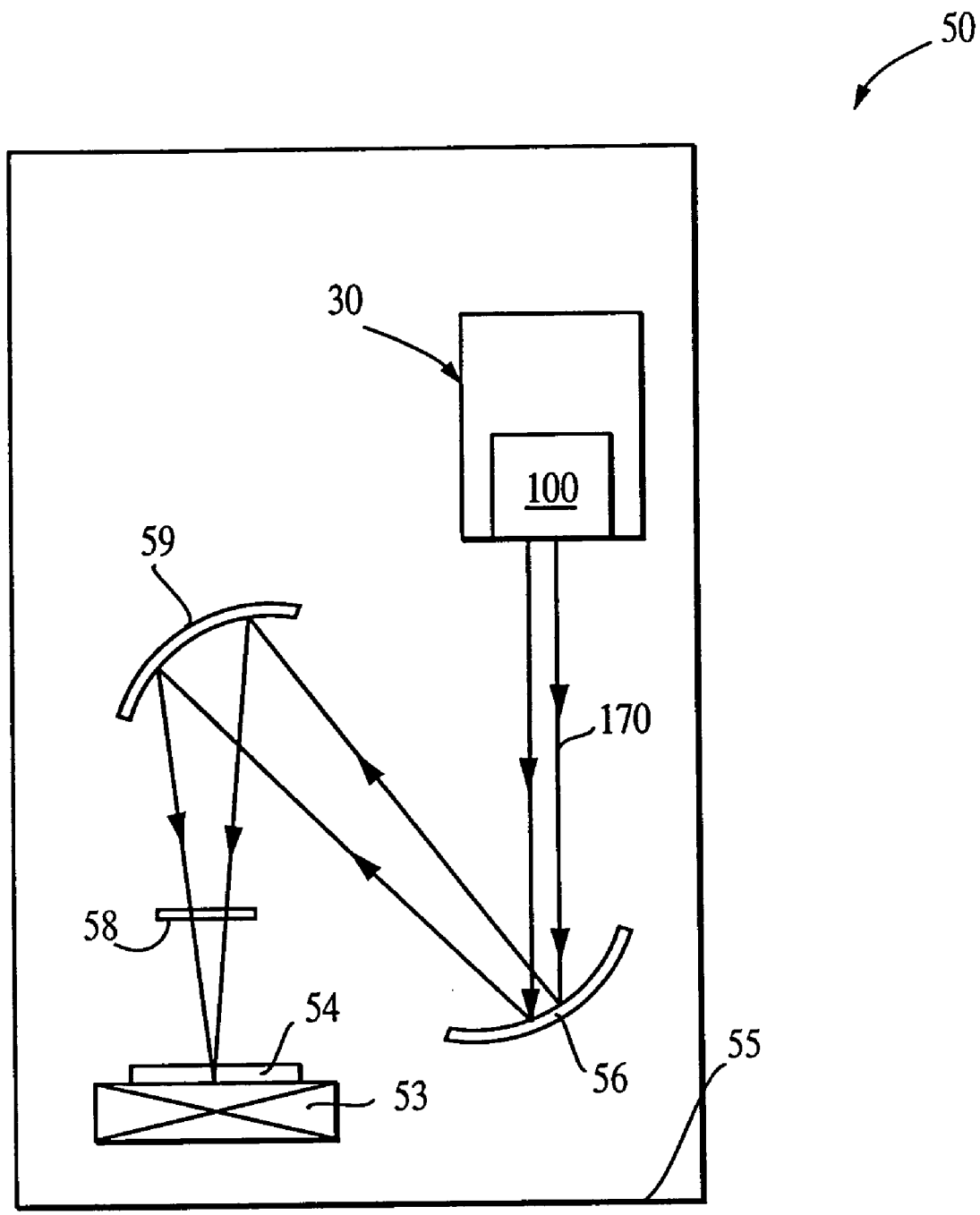
FIG. 10 illustrates a lithography system fabricated in accordance with one aspect of the invention.
Figure 11:
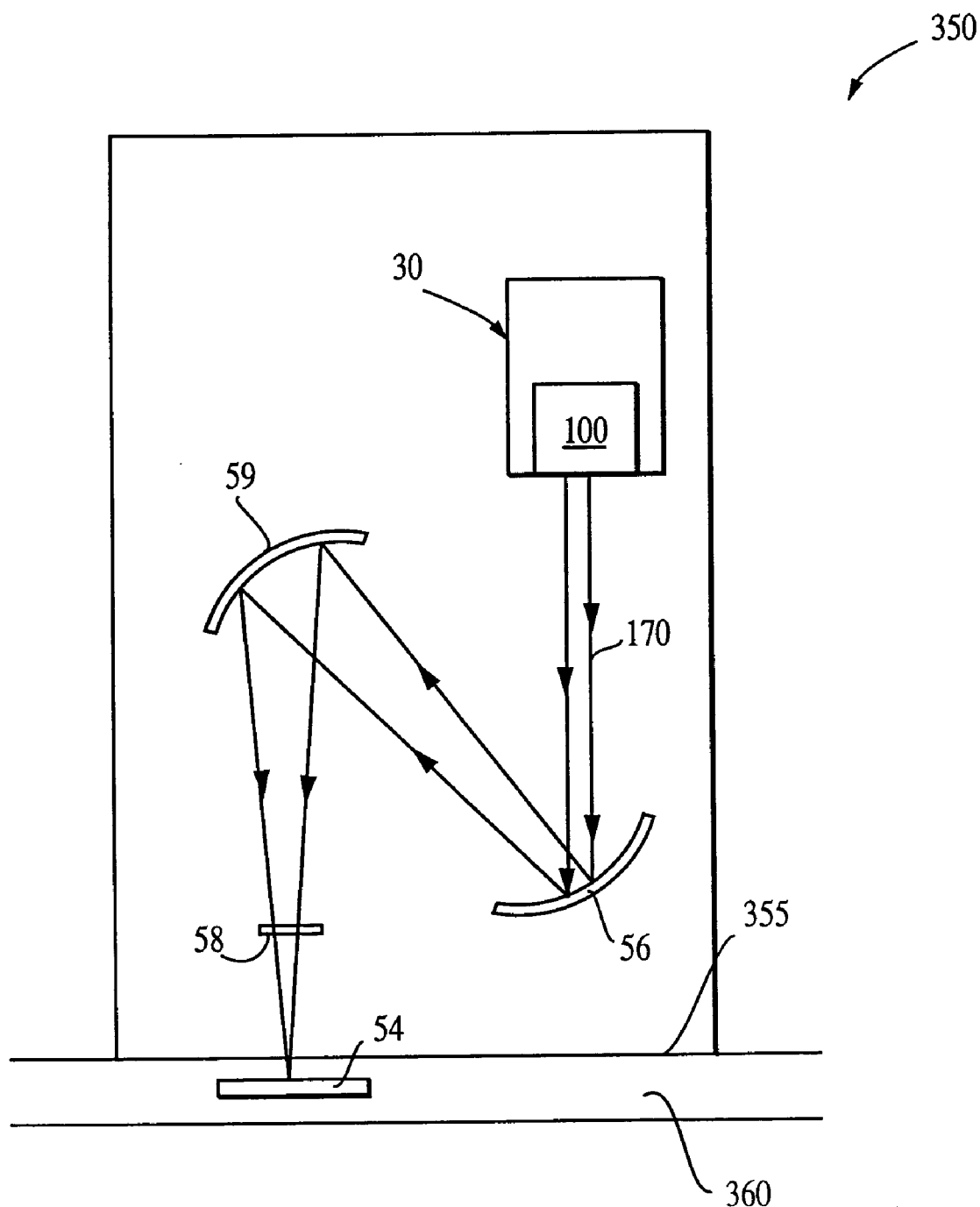
FIG. 11 illustrates a second lithography system fabricated in accordance with the invention.

FIG. 10 illustrates a lithography system 50 constructed with a pressure system 30 containing a discharge device 100. The pressure system 30 supplies pressurized gas to the microcavity. Radiation 170 exits through the bottom of device 100 and strikes a first optical mirror 56. The embodiment is shown with only a second optical mirror 59 although additional mirrors could be added. The second mirror 59 reflects the radiation 170 through a mask or reticle 58 to the wafer 54. The wafer 54 is shown on a wafer station 53. The mirrors 56, 59 have reflective surfaces formed from molybdenum silicon (MoSi) or molybdenum beryllium (MoBe) compounds. Such compounds have a peak normal incidence reflectiveness of approximately 70% within a reflectivity bandwidth of approximately 1 nanometer. These compounds have high reflectivity in the 11 to 14 nanometer spectral wavelength region. In particular, multi-layer MoSi reflecting surfaces have their highest reflectivity in the 13 to 14 wavelength region and MoBe reflecting surfaces have their highest reflectivity in the 11 to 12 wavelength region FIG. 11 illustrates a second lithography system 350. The system 350 differs from FIG. 10 in that the wafer 54 is located outside the lithography system 350. The wafer 54 is conveyed on a wafer transport 360. The radiation 170 is transmitted across the system perimeter 355. The system 350 may be suitably arranged to prevent atmosphere contamination and refraction of the radiation 170.

Having thus described in detail the preferred embodiments of the invention, it is to be understood that the invention defined by the appended claims is not to be limited by particular details set forth in the above description as many apparent variations thereof are possible without departing from the spirit or scope of the invention. Accordingly, the above description and accompanying drawings are only illustrative of preferred embodiments which can achieve the features and advantages of the present invention. It is not intended that the invention be limited to the embodiments shown and described in detail herein. The invention is only limited by the scope of the following claims.

What is claimed as new and desired to be protected by Letters Patent of the United State is:

1. A method of operating a microcavity discharge device, said method comprising the steps of:
    supplying an electrical current to excite a discharge gas located within said device, said electrical current including a constant direct current and a pulsed current; and
    emitting radiation produced by said excited discharge gas through a closed end of said microcavity discharge device.

2. The method of claim 1, wherein said radiation has a wavelength that is less than 100 nanometers.

3. The method of claim 1, wherein said emitting step includes emitting radiation through a metal.

4. The method of claim 1, further comprising the step of supplying said constant direct current at a voltage of approximately 220 Volts.

5. The method of claim 4, further comprising the step of supplying said constant direct current in the range of approximately 1 to 3 milliamps.

6. The method of claim 4, further comprising the step of supplying said pulsed current in the range of approximately 60 to 100 amps.

7. The method of claim 1, wherein the step of supplying said pulsed current comprises applying a pulsed current, each pulse with a duration of approximately $1 \times 10^{-6}$ seconds or less.

8. The method of claim 1, wherein the step of supplying said pulse current comprises applying a pulsed current at a rate up to approximately 1000 pulses per second.

9. The method of claim 1, wherein the step of supplying said pulse current comprises spacing said pulse current at approximately 0.001 seconds or greater.

10. A method of operating a lithography system, the method comprising:
supplying an electric current to a discharge gas located within a pressure system comprising a microcavity discharge device, said electric current comprising a constant direct current and a pulsed current;
emitting radiation through a closed end of said microcavity device; and
deflecting an optical path of the emitted radiation to a wafer.

11. The method of claim 10, wherein the step of deflecting the path of the emitted radiation comprises reflecting said radiation from at least one mirror.

12. The method of claim 11, wherein a reflecting surface of said at least one mirror is coated with one of molybdenum silicon (MoSi) and molybdenum beryllium (MoBe) compounds.

13. The method of claim 12, wherein said compounds have a peak normal incidence reflectiveness of approximately 70% within a reflectivity bandwidth of approximately 1 nanometer.

14. The method of claim 12, wherein said reflecting surface of said at least one mirror is coated with multiple layers of MoSi.

15. The method of claim 10, wherein the step of deflecting said emitted radiation to a wafer comprises reflecting the radiation through at least one of a mask and a reticle.

16. The method of claim 10, further comprising the step of attaching a substrate having an aperture to the closed end of said microcavity discharge device, the substrate aligned with the discharge device so that the radiation is emitted out through the aperture.

17. The method of claim 16, wherein said aperture in said substrate has sloped sidewalls, the sloped sidewalls acting to direct the emitted radiation.

18. The method of claim 10, further comprising the step of mounting the wafer on a wafer station.

19. The method of claim 18, wherein said wafer is mounted on a mobile wafer transport station.

20. The method of claim 19, wherein the step of emitting radiation comprises transmitting said radiation across a system perimeter while said wafer is mobile on said wafer station.

21. The method of claim 10, further comprising the step of configuring said lithography station to prevent atmospheric contamination and refraction of said emitted radiation.

22. A method of exposing photoresist on a wafer, the method comprising:
supplying a discharge gas into an open end of a microcavity discharge device located within a pressure system;
supplying an electric current to said discharge device, said electric current including a constant direct current and a pulsed current;
emitting radiation through a closed end of said microcavity device; and
reflecting said emitted radiation from at least one optical mirror, said optical mirror reflecting said radiation to the wafer through openings in a patterned device, said radiation applied to said wafer effectively exposing said photoresist on said wafer.

23. The method of claim 22, wherein said wafer includes an integrated circuit, said method comprising exposing said photoresist during integrated circuit fabrication.

24. The method of claim 22, wherein said patterned device comprises at least one of a mask and a reticle.

25. A method of operating a microcavity device comprising:
supplying a discharge gas to an open end of a microcavity device; and
causing said discharge gas to emit radiation with a wavelength of less than 100 nanometers through a closed end of said device.

26. The method of claim 25, further comprising the step of applying an electrical current to said discharge gas, said current comprising a constant direct current and a pulsed current.

27. The method of claim 26, wherein the step of supplying said electrical current comprises applying a pulsed current at a rate of up to approximately 1000 pulses per second.

28. The method of claim 25, further comprising the step of reflecting said emitted radiation onto a wafer.

29. The method of claim 28, wherein the step of reflecting said emitted radiation comprises reflecting said radiation from a reflective surface of a first optical mirror to at least a second optical mirror, said second optical mirror reflecting said radiation to said wafer.

* * * * *